United States Patent
Kwak

(10) Patent No.: US 6,933,214 B2
(45) Date of Patent: Aug. 23, 2005

(54) METHOD OF MANUFACTURING FLASH MEMORIES OF SEMICONDUCTOR DEVICES

(75) Inventor: Noh Yeal Kwak, Kyungki-Do (KR)

(73) Assignee: Hynix Semiconductor Inc., Kyungki-do (KR)

( * ) Notice: Subject to any disclaimer, the term of this patent is extended or adjusted under 35 U.S.C. 154(b) by 54 days.

(21) Appl. No.: 10/618,492

(22) Filed: Jul. 11, 2003

(65) Prior Publication Data

US 2004/0097059 A1 May 20, 2004

(30) Foreign Application Priority Data

Nov. 20, 2002 (KR) .................................. 10-2002-0072242

(51) Int. Cl.$^7$ ........................................... H01L 21/265
(52) U.S. Cl. ...................... 438/522; 438/302; 438/514; 438/525; 438/530
(58) Field of Search ................................ 438/301, 302, 438/514–522, 525, 526, 529, 530

(56) References Cited

U.S. PATENT DOCUMENTS

| 5,605,849 A | * | 2/1997 | Chen et al. ................. 438/345 |
| 6,245,639 B1 | * | 6/2001 | Tsai et al. ................... 438/424 |
| 6,362,059 B2 | * | 3/2002 | Fukasaku et al. ........... 438/289 |
| 6,555,484 B1 | * | 4/2003 | Ramkumar et al. ......... 438/766 |

* cited by examiner

Primary Examiner—Asok Kumar Sarkar
(74) Attorney, Agent, or Firm—Marshall, Gerstein & Borun LLP

(57) ABSTRACT

Disclosed is a method of manufacturing a semiconductor device. A monoatomic dopant having a high atomic weight is implanted to form an ion implantation layer, instead of using a dopant of a small atomic weight such as B or a molecular ion such as a $BF_2$ in order to control the threshold voltage of the semiconductor device. Therefore, in an annealing process for mitigating damage caused by ion implantation, it is possible to limit TED (transient enhanced diffusion) of the dopant and prevent degradation of the film quality due to outgasing.

12 Claims, 2 Drawing Sheets

METHOD OF MANUFACTURING FLASH MEMORIES OF SEMICONDUCTOR DEVICES

BACKGROUND

1. Technical Field

A method of manufacturing semiconductor devices is disclosed which can inhibit TED (transient enhanced diffusion) of dopant implanted into the bottom structure and which can also limit degradation of the oxide film quality at the upper side due to outgasing that can occur during the annealing after the ion implantation is implemented.

2. Discussion of the Related Art

In the manufacture of semiconductor devices, ion implantation processes, deposition processes and etching processes are all used.

In the manufacture flash memory devices or transistors, a well region is formed by means of an ion implantation process. An ion implantation layer for controlling the threshold voltage is then formed at a given depth of the well. Next, before a pad nitride film is formed, a tunnel oxide film and a first polysilicon layer for forming a floating gate is formed and is then patterned.

Thereafter, the structure is etched to form a trench. A wall sacrificial oxidation process and a well oxidation process are then sequentially implemented to form an isolation film by means of a SA-STI (self-aligned shallow trench isolation) method for electrically isolating the devices.

In the above process, in case of a flash memory device using an nMOS transistor as a cell, boron (B) is implanted to form an ion implantation layer for adjusting the threshold voltage. At this time, as the cell is programmed and erased in a sector program/erase mode of 512 byte unit of the flash device, the threshold voltages of the cells need to be uniform within the unit cell block.

When using FN (Fowler-Nordheim) tunneling and not HCE (hot carrier effect) as a program mode, distribution of the dopant to control the threshold voltage becomes an important parameter. For this reason, it is important that the distribution of the ion implantation layer not be changed by the subsequent annealing process so that the operation speed can be increased by controlling the threshold voltage.

If the isolation film is formed by the SA-STI method, however, a transient enhanced diffusion (TED) of the dopant occurs during the high temperature oxidization process, which changes the threshold voltage of the device. Furthermore, if a large quantities of dopant are implanted to adjust the threshold voltage of the device, RDG (remained dopant gettering) may occur due to the large quantities of dopant used. RDG can cause device failure. Therefore, in order to minimize damage caused by ion implantation, high temperature annealing must be implemented as a subsequent process which limits the amount of dopant that can be used to control the threshold voltage.

In addition, in the case of $BF_2$ which is widely used as a dopant when forming shallow surface channels, dopant loss occurs due to outgasing caused by the subsequent annealing process. In particular, fluorine-induced (F-induced) outgasing during annealing is inevitable due to the large quantities of fluorine (F) present and its tendancy to be outgassed. As a result, the oxide film quality is degraded.

SUMMARY OF THE DISCLOSURE

Accordingly, a method of manufacturing semiconductor devices is disclosed which is capable of limiting TED (transient enhanced diffusion) of the dopant and preventing degradation of the oxide film quality due to outgasing during annealing thereby mitigating damage or defects caused by ion implantation. In the disclosed process, a monoatomic dopant having a large atomic weight is implanted to form an ion implantation layer, instead of using a dopant of a low atomic weight such as B or a low molecular weight such as a $BF_2$ which has been usually employed, when the ion implantation layer is formed to control the threshold voltage of the semiconductor device.

A method of manufacturing semiconductor devices according to this disclosure comprises providing a semiconductor substrate for which given processes for forming the semiconductor device have been implemented, and implanting a Group III monoatomic dopant having a higher atomic weight than boron at a given depth of the semiconductor substrate by means of an ion implantation process, thus forming an ion implantation layer.

In the above process, the dopant may be implanted as a screen oxide film is formed.

The ion implantation process includes implanting the dopant at a concentration range $5 \times 10^{11} \sim 5 \times 10^{13}$ ion/cm$^2$ with an energy range of 10~50 KeV. The dopant may be indium. Further, the ion implantation process may include implanting the dopant at a tilt angle of 3~3°.

Furthermore, a rapid thermal process may be implemented in order to activate the dopant after the ion implantation layer is formed. At this time, the rapid thermal process may be implemented at a temperature range of 800~1100° C. at a heating rate range of 20~50° C./sec for time period range of 5~30 seconds. Also, the rapid thermal process may be implemented under a nitrogen atmosphere.

BRIEF DESCRIPTION OF THE DRAWINGS

The above and other features and advantages of the disclosed process will be apparent from the following detailed description of the preferred embodiments in conjunction with the accompanying drawings, wherein.

DETAILED DESCRIPTION OF THE PRESENTLY PREFERRED EMBODIMENTS

FIG. 1A~FIG. 1E are cross-sectional views of semiconductor devices for explaining a method of manufacturing semiconductor device according to a preferred embodiment.

Figure 1A:
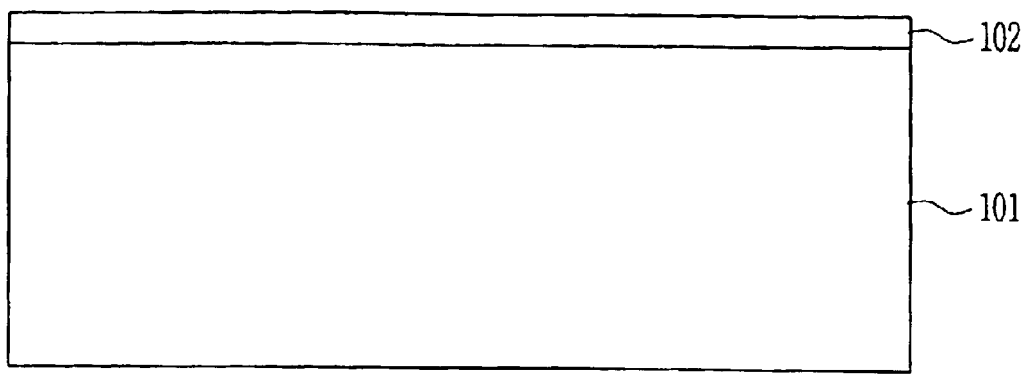
FIG. 1A~FIG. 1E are cross-sectional views of semiconductor devices for explaining a method of manufacturing the device according to a preferred embodiment.

Referring to FIG. 1A, a screen oxide film 102 is formed on a semiconductor substrate 101 as a sacrificial oxide film for crystal defect prohibition or surface treatment of the surface of the semiconductor substrate 101. The screen oxide film 102 also serves to prohibit inter-diffusion by channeling of the dopant that occurs in the ion implantation process for forming the wells. In FIG. 1A, the screen oxide film 102 is formed using a dry or wet oxidization mode at a temperature range of 750~800° C. and is formed with a thickness range of 70~100 Å.

Meanwhile, a cleaning process may be implemented before the screen oxide film 102 is formed. At this time, the cleaning process may be implemented by sequentially using hydrofluoric acid (DHF) where $H_2O$:HF are mixed in a ratio of 50:1~100:1 with a SC-1($NH_4OH/H_2O_2/H_2O$) solution, or sequentially using a BOE (buffered oxide etchant) solution where $NH_4F$:HF is mixed in a ratio range of 4:1~7:1 and is diluted with $H_2O$ to the ratio range of 1:100~1:300 in combination with the SC-1($NH_4OH/H_2O_2/H_2O$) solution.

Figure 1B:
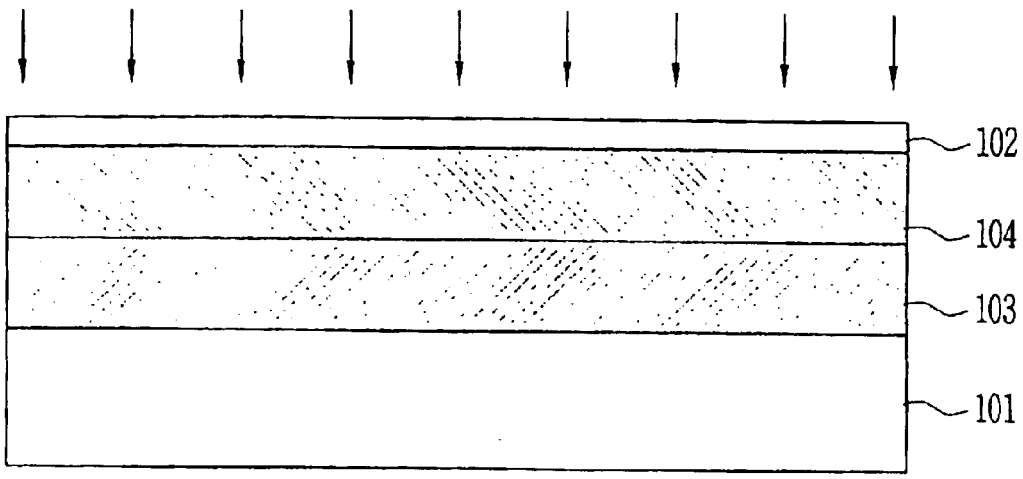

Referring to FIG. 1B, a triple n well 103 is formed on a region where an n channel will be formed by means of the ion implantation process. A p well 104 is consecutively formed in depth shallower than the triple n well 103. The triple n well 103 may be formed by implanting P at a concentration range of $5\times10^{12}$~$5\times10^{13}$ ion/cm$^2$ and with an energy range of 500~2000 KeV. The p well 104 may be formed by implanting B at a concentration range of $1\times10^{12}$~$5\times10^{13}$ ion/cm$^2$ and with an energy range of 200~1000 KeV. Meanwhile, an n well (not shown) is formed in another region where a p channel device is to be formed. The n well may be formed by implanting P at a concentration range of $1\times10^{12}$~$5\times10^{13}$ ion/cm$^2$ with an energy range of 200~1000 KeV. In the above procedure, it is preferred that the ion implantation process for forming the p well is implemented at a tilt angle range of 3~13° for the purpose of prohibiting or limiting dopant channeling.

Figure 1C:
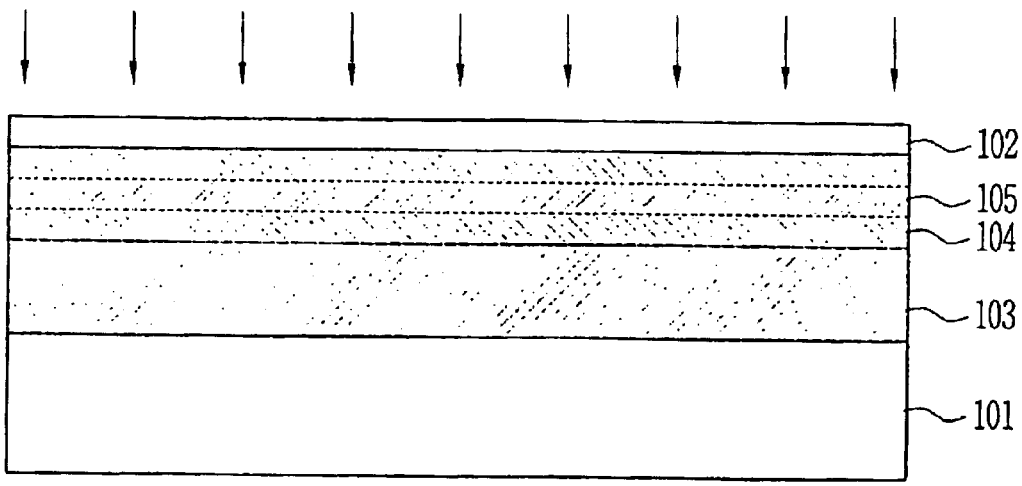

By reference to FIG. 1C, an ion implantation layer 105 for controlling the threshold voltage is formed at a given depth of the p well 104 by means of the ion implantation process in order to control the threshold voltage of the semiconductor device that will be formed on the semiconductor substrate 101. The ion implantation layer 105 is formed by implanting a monoatomic dopant having a high atomic weight, instead of using a dopant having a low atomic weight such as B or a low molecular weight dopant such as BF$_2$ as taught by the prior art. For example, the ion implantation layer 105 may be formed by implanting Group III dopant having a higher atomic weight than boron and preferably monoatomic, such as indium although other Group III dopants could be utilized. At this time, the ion implantation process may be implemented using a dopant concentration range of $5\times10^{11}$~$1\times10^{13}$ ion/cm$^2$ with an energy range of 10~50 KeV. Meanwhile, like the ion implantation process for forming the p and/or n wells, even when the ion implantation process for controlling the threshold voltage is implemented, it is preferred that ion implantation is implemented at a tilt angle range of 3~13° in order to limit dopant channeling of the channel region in a flash device using a buried channel.

Immediately after the ion implantation layer 105 for controlling the threshold voltage is formed, an annealing process capable of minimizing exposure at high temperature such as RTP (rapid thermal process) is implemented in order to maximize dopant activation. Only activation of the dopant may be maximized while preventing unnecessary rediffusion of the dopant. At this time, the annealing process may be implemented at a temperature range of 800~1100° C. for a time period range of 5~30 seconds at a heating rate range of 20~50° C./sec. Further, the annealing process may be implemented under a nitrogen atmosphere in order to prevent formation of a native oxide film.

Figure 1D:
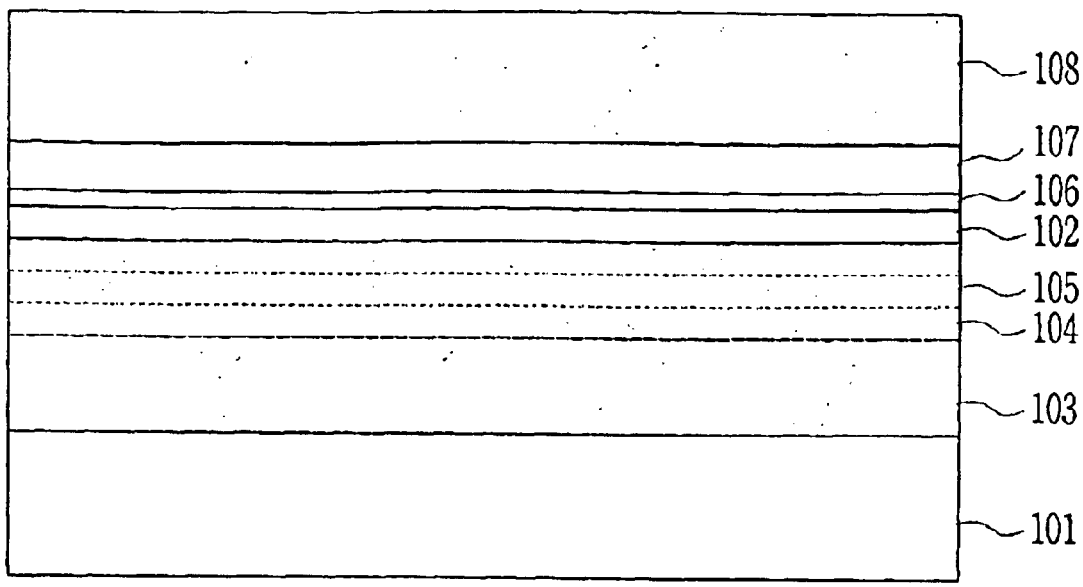

Referring to FIG. 1D, after the screen oxide film (102 in FIG. 1C) is removed, a gate oxide film (tunnel oxide film 106 in case of flash devices), a conductive material layer 107 and a pad nitride film 108 are sequentially formed.

In the above, the screen oxide film (102 in FIG. 1C) is removed by a cleaning process sequentially using hydrofluoric acid (DHF) with a H$_2$O:HF ratio of 50:1~100:1 and SC-1(NH$_4$OH/H$_2$O$_2$/H$_2$O) solution.

Thereafter, the gate oxide film 106 is formed by a wet oxidization process at a temperature range of 750~800° C. The gate oxide film 106 is then annealed under nitrogen atmosphere at a temperature range of 900~910° C. for a time period range of 20~30 minutes in order to minimize an interface defect of the semiconductor substrate 101 and the gate oxide film 106.

Meanwhile, the conductive material layer 107 may be formed by depositing a doped polysilicon layer the grain size of which is minimized, by means of a LP-CVD (low pressure chemical vapor deposition) method using SiH$_4$ or Si$_2$H$_6$ and PH$_3$ gas at a temperature range of 580~620° C. under a low range of 0.1~3 Torr. At this time, the impurity (P) concentration of the doped polysilicon layer is controlled to a concentration range of $1.5\times10^{20}$~$3.0\times10^{20}$ atoms/cc and the doped polysilicon layer is formed in thickness range of 250~500 Å.

The pad nitride film 108 formed on the conductive material layer 107 may be formed in thickness range of 900~2000 Å by means of a LP-CVD method.

Figure 1E:
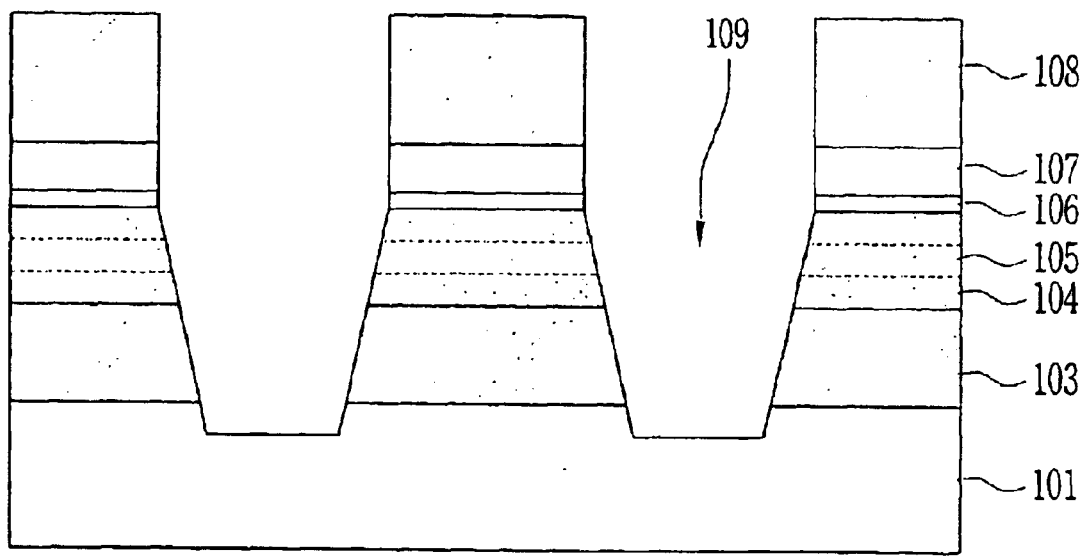

Referring to FIG. 1E, the pad nitride film 108, the conductive material layer 107 and the gate oxide film 106 in the isolation region are sequentially removed by means of an etch process, thus exposing the semiconductor substrate 101 in the isolation region. Next, the exposed semiconductor substrate 101 in the isolation region is etched by a given depth to form a trench 109. The trench 109 is then buried with an insulating material (not shown) to form an isolation film (not shown) of a STI (shallow trench isolation) structure (also not shown). In the above, a high density plasma (HDP) oxide film may be used as the insulating material. At this time, the high density plasma (HDP) oxide film is formed in thickness range of 4,000~10,000 Å on the entire structure so that the trench 109 is completely buried while preventing generating of void spaces.

Although not shown in the drawings, a chemical mechanical polishing process as a subsequent process is carried out so that the insulating material remains only up to a target height rather than the surface of the semiconductor substrate 101 while removing the insulating material on the pad nitride film 108. Next, after a wet cleaning process using diluted HF is implemented, a conductive material like the conductive material 107 is formed in thickness range of 400~1000 Å. A common process of manufacturing a flash memory cell is implemented to complete the fabrication of the flash memory cell.

As described above, the disclosed methods have the following benefits.

First, in the memory cell of a flash device in which the isolation film of the STI structure requiring one or more high temperature processes, the use of a monoatomic dopant having a high atomic weight is implanted to form an ion implantation layer for controlling the threshold voltage. Therefore, the flash device can be fabricated while minimizing the TED phenomenon.

Second, the uniformity of the threshold voltage can be secured within the target range while minimizing the TED phenomenon. Therefore, program/erase operation characteristics of a cell block unit can be improved in the resulting flash memory device.

Third, after the ion implantation layer is formed, there is no outgasing in the subsequent annealing process. It is thus possible to prevent degradation of the film quality of the gate oxide film.

Fourth, it is possible to form a gate oxide film of a high quality by preventing degradation of the film quality of the gate oxide film caused by the ion implantation processes. Accordingly, it is possible to improve the electrical characteristics and reliability of the flash memory device using FN tunneling.

Fifth, as dopant damage caused by diffusion is minimized, it is possible to control the threshold voltage with a minimum amount of ion implantation. Furthermore, as generation of ion implantation damage within the channel region is limited, it is possible to minimize generation of the leakage current.

The forgoing embodiments are merely exemplary and are not to be construed as limiting of this disclosure. The present teachings can be readily applied to other types of apparatuses. The above description is intended to be illustrative, and not to limit the scope of the claims. Many alternatives, modifications, and variations will be apparent to those skilled in the art.

What is claimed is:

1. A method of manufacturing a semiconductor device, comprising:

providing a semiconductor substrate for which given processes for forming the semiconductor device have been implemented;

forming a screen oxide film on the substrate;

implanting a Group III monoatomic dopant having a higher atomic weight than boron at a given depth within the p well of the semiconductor substrate by means of an ion implantation process, thus forming an ion implantation layer in the p well; and implementing a rapid thermal process to activate the dopant after the ion implantation layer is formed and before the screen oxide film is etched or removed.

2. The method as claimed in claim 1, wherein the Group III ion implantation process includes implanting the Group III monoatomic dopant at a concentration range of $5 \times 10^{11} \sim 10^{13}$ ion/cm$^2$ with an energy range of 10~50 KeV.

3. The method as claimed in claim 1, wherein the dopant is indium.

4. The method as claimed in claim 1, wherein the ion implantation process includes implanting the dopants at a tilt angle range of 3~13°.

5. The method as claimed in claim 1, wherein the rapid thermal process is implemented at a temperature range of 800~1100° C. at a heating rate range of 20~50° C./sec for a time period range of 5~30 seconds.

6. The method as claimed in claim 1, wherein the rapid thermal process is implemented under a nitrogen atmosphere.

7. A method of manufacturing a semiconductor device, comprising:

forming a screen oxide film on a semiconductor substrate;

forming a p well in the semiconductor substrate by implanting boron in the substrate by means of an ion implantation process;

forming an ion implantation layer in the p well by implanting a Group III monoatomic dopant having a higher atomic weight than boron at a predetermined depth within the p well by means of an additional ion implantation process; and implementing a rapid thermal process to activate the dopant after the ion complantation layer is formed and before the screen oxide film is etched or removed.

8. The method as claimed in claim 7, wherein the Group III monoatomic dopant is implanted at a concentration range of $5 \times 10^{11} \sim 1 \times 10^{13}$ ion/cm$^2$ with an energy range of 10~50 KeV.

9. The method as claimed in claim 7, wherein the dopant is indium.

10. The method as claimed in claim 7, wherein the ion implantation process includes implanting the dopants at a tilt angle range of 3~13°.

11. The method as claimed in claim 7, wherein the rapid thermal process is implemented at a temperature range of 800~1100° C. at a heating rate range of 20~50° C./sec for a time period range of 5~30 seconds.

12. The method as claimed in claim 11, wherein the rapid thermal process is implemented under a nitrogen atmosphere.

* * * * *

UNITED STATES PATENT AND TRADEMARK OFFICE
CERTIFICATE OF CORRECTION

| | | |
|---|---|---|
| PATENT NO. | : 6,933,214 B2 | Page 1 of 1 |
| APPLICATION NO. | : 10/618492 | |
| DATED | : August 23, 2005 | |
| INVENTOR(S) | : Noh Yeal Kwak | |

It is certified that error appears in the above-identified patent and that said Letters Patent is hereby corrected as shown below:

<u>In the Claims:</u>

At Column 5, line 29, "$5 \times 10^{11} \sim 10^{13}$" should be -- $5 \times 10^{11} \sim 1 \times 10^{13}$ --.

At Column 6, line 18, "complantation" should be -- implantation --.

Signed and Sealed this

Tenth Day of April, 2007

JON W. DUDAS
*Director of the United States Patent and Trademark Office*